United States Patent [19]
Amoroso

[11] Patent Number: 5,531,601
[45] Date of Patent: Jul. 2, 1996

[54] FABRIC BATTERY POUCH

[76] Inventor: Eugene C. Amoroso, 23656 N. 44th La., Glendale, Ariz. 85310

[21] Appl. No.: 494,101

[22] Filed: Jun. 23, 1995

[51] Int. Cl.⁶ .............................. H01R 33/00; F21L 15/08
[52] U.S. Cl. .............................. 439/37; 439/500; 439/931; 362/103
[58] Field of Search .............................. 439/37, 55, 931, 439/500; 429/96, 98, 121, 123, 48

[56] References Cited

U.S. PATENT DOCUMENTS 5,371,657  12/1994  Wiscombe .............................. 362/103

Primary Examiner—P. Austin Bradley
Assistant Examiner—T. C. Patel
Attorney, Agent, or Firm—Jordan M. Meschkow; Lowell W. Gresham; Mark M. Takahashi

[57] ABSTRACT

A battery pack is provided for use in applications where lightweight and flexibility are desired, such as for powering an illuminated clothing article. A battery pack is provided consisting of a first and second fabrics, each having conductive traces applied upon its inside. The fabrics are sealed together forming a battery pouch area to hold and electrically connect a battery that is placed within it. Because the pack is made of fabric, and requires no connecting wires or hard case, excess weight and bulk is eliminated, resulting in a comfortable clothing article within a natural drape.

15 Claims, 1 Drawing Sheet

FABRIC BATTERY POUCH

TECHNICAL FIELD OF THE INVENTION

The present invention relates generally to battery packs. More specifically, the present invention relates to fabric battery packs that are flexible for use in clothing and other such applications.

BACKGROUND OF THE INVENTION

In the design of illuminated clothing it is desirable that the clothing remain flexible and pliable. Flexibility is the key to clothing being comfortable and having a natural drape. Previous methods for connecting a battery to illuminate an article of clothing have required the use of plastic or some other hard material to store the battery inside the article of clothing. The hard battery packs created unwanted bulges in the clothing, interfering with the desired natural drape. The hard packs also added weight to the clothing above that added by the batteries themselves.

Additionally, previous battery packs were attached to the illuminating circuitry using ordinary wires or soldered connections. These wires also adversely effected the natural drape of the clothing, and added extra weight to the devices. These hard packs and wires also presented a barrier to successful washing of the illuminated clothing.

SUMMARY OF THE INVENTION

Accordingly, it is an advantage of the present invention that a battery is held and connected without the use of wires or other external connections.

Another advantage of the present invention is that the battery is held in a flexible pouch that does not impede movement the movement of the wearer.

Another advantage of the present invention is that the battery pouch does not adversely affect the natural drape of the clothing.

Another advantage of the present invention is that it can be washed with the clothing.

The above and other advantages of the present invention are carried out in one form by a battery pack made of two pieces of fabric having electrically conductive traces, attached together to hold and connect a battery between them.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENT(S)

A battery pack for illuminating clothing is provided that does not require a hard battery pack or external wire connection. The battery pack uses two fabrics having conductive traces applied to their surface. The fabrics are attached together such that a battery, when placed between them, is electrically connected to the traces.

Figure 1:
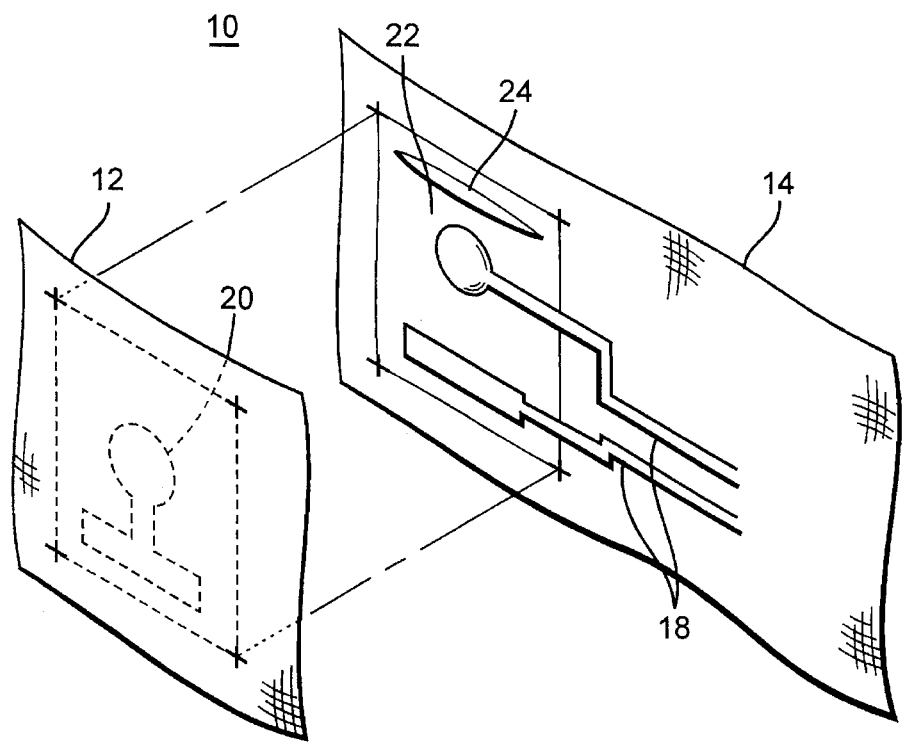
FIG. 1 is a perspective expanded view representing a fabric battery pack.

Turning now to the figures for a more detailed description of the preferred embodiments, FIG. 1 is a perspective expanded view representing a fabric battery pack. A fabric battery pack 10 is made using a first fabric portion 12 and a second fabric portion 14. Preferably, either first fabric 12 or second fabric 14 can be the article of clothing to be illuminated itself. The fabrics can be any type of cloth material, including those typically used in clothing, such as felt or cotton. The fabrics 12 and 14 can also be a material such as Mylar or rubber. It may also be desirably for the fabrics 12 and 14 to have elastic type properties, to enhance the ability to firmly hold a battery.

In one embodiment the first and second fabrics 12 and 14 are coated on at least a portion of one side with a backing type material (not shown in figures). The backing is preferably a smooth, continuous, flexible, polymeric material which is both electrically insulating and pliable. Examples of backing materials are polyurethane and PVC coating. To maintain the comfort and drape of the illuminated garment it is desirable that the backing be much thinner than the fabric it is applied to.

Conductive traces 18 are formed on the second fabric 14. Similar conductive traces 20 are formed on the first fabric 12 (hidden in figure). In some embodiments the conductive traces 18 and 20 can be applied directly to fabrics 12 and 14. In other embodiments, the conductive traces 18 and 20 are formed on backing coated upon fabrics 12 and 14, the conductive traces being in juxtaposition with the fabrics. These conductive traces 18 and 20 can be made by applying a flexible conductive ink to the fabric or backing. The conductive ink is typically a liquid polymeric ink having conductive particles such as silver within. One such conductive ink is sold under the trade-name 102-05F by Creative Materials of Tynsboro, Mass. Alternately, the conductive traces can be applied copper. The copper works well if the fabric is a type of Mylar or plastic sheet.

The first fabric 12 and second fabric 14 are attached together as represented in FIG. 1. This creates a battery pouch area 22 between the first and second fabrics 12 and 14 that holds the battery (not shown in figure) in the correct position to be electrically connected to the conductive traces 18 and 20. The battery used is preferably a "button type" battery having a terminal on each side. Button type batteries are typically used in cameras and watches because of their small size and low weight. A slit 24 can be provided for the battery to be placed in the pouch are 22. Alternatively, a gap between the first and second fabrics 12 and 14 can be provided for placing and removing the battery from the pouch area 22.

The placing and removing of the battery in the pouch area 22 can serve as a switch to turn on or off the illuminated article of clothing. This method provides a simple and reliable way to control the illumination, without the extra weight and bulk of a normal mechanical type switch. It also allows the washing of the clothing with the battery removed.

Figure 2:
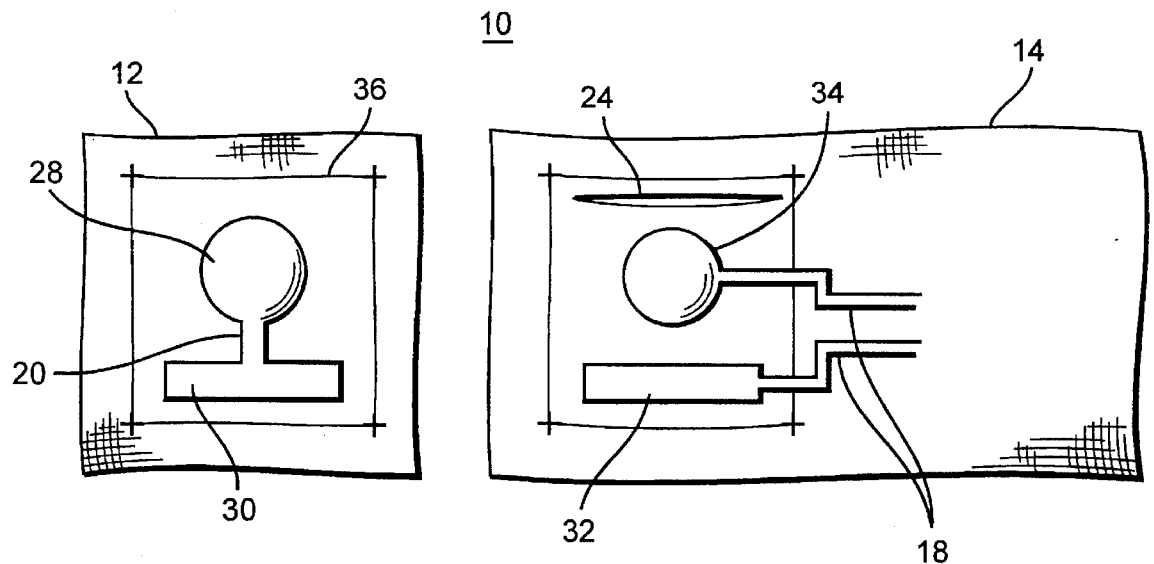
FIG. 2 is a plan view representing the components of a fabric battery pack.

Turning now to FIG. 2, FIG. 2 is a plan view representing the components of a battery pack 10. The battery pack has a first fabric 12 and second fabric 14. Upon the first fabric is a conductive trace 20. The conductive trace 20 is shaped with a terminal portion 28 to contact one terminal of a battery. The conductive trace has a bottom portion 30. The bottom portion is used to connect the battery to a corresponding portion 32 of the conductive trace 18 of the second fabric 14. Conductive trace 18 also has a terminal portion 34. The terminal portion 34 is shaped to connect to the opposite terminal of the battery as terminal portion 28. The terminal portions 28 and 34 may have a protrusion or "bump" to help assure a good contact between the battery and the terminal portions. The conductive trace 18 extend from portions 32 and 34 to the rest of the illuminated clothing circuitry as needed.

In one embodiment, the first fabric 12 is attached to the second fabric 14 using sonic welding along the first fabric's perimeter, represented by line 36. Such welding allows a fine-line bonding and leaves the central part of the area not coupled. Other methods can be used to attach the fabrics, such as glue, stitching or heat transfer.

Attaching the fabrics 12 and 14 together along perimeter 14 forms a tight pocket to hold the battery firmly in place after it is slid in through slit 24. Alternatively, if a slit is not used then one side of the perimeter 14 can be left unsealed to allow insertion and removal of the battery. Care must also be taken in attaching fabrics 12 and 14 together to assure that a good electrical contact is formed between portion 30 of trace 20 and portion 32 of trace 18.

In summary, the present invention provides lightweight, flexible battery pack for use in illuminating providing electrical power to illuminating clothing. The pack uses two fabrics having conductive traces attached together such that a battery placed between the fabrics is electrically connected to the conductive traces.

It is of course possible to make connections for multiple batteries in one garment using the preferred embodiment. It would only be necessary to provide conductive traces between the batteries in a manner to connect them either in series or in parallel.

The present invention has been described above with reference to a preferred embodiments. However, those skilled in the art will recognize that changes and modifications may be made in these preferred embodiments without departing from the scope of the present invention. For example, the shape of the battery contacts can be adjusted to accommodate other battery shapes. These and other changes and modifications which are obvious to those skilled in the art are intended to be included within the scope of the present invention.

I claim:

1. A flexible battery pack for holding and connecting a battery comprising:

a first fabric;

a first conductive trace upon said first fabric;

a second fabric;

a second conductive trace upon said second fabric; and wherein the first fabric is attached to the second fabric such that said first and second conductive traces are configured to electrically connect to a said battery when placed between said first and second fabrics.

2. The battery pack of claim 1 wherein said first and second fabric comprises felt.

3. The battery pack of claim 1 wherein said first fabric is attached to said second fabric using sonic welding.

4. The battery pack of claim 1 wherein said first fabric has a perimeter and said first fabric is attached to said second fabric by sonically welding along said first fabric perimeter.

5. The battery pack of claim 1 wherein the second fabric comprises a slit for placing said battery between said first and second fabrics.

6. The battery pack of claim 1 wherein the first and second conductive traces comprise conductive protrusions for improving said electrical connection to said battery.

7. The battery pack of claim 1 wherein the first conductive fabric comprises an elastic type fabric.

8. The battery pack of claim 1 wherein the first and second conductive traces comprise polymeric ink having silver conductive particles.

9. The battery pack of claim 1 wherein the first fabric is attached to the second fabric by glue.

10. The battery of pack of claim 1 wherein the second fabric is Mylar and the second conductive traces comprise applied copper.

11. The battery pack of claim 1 wherein said first and second fabrics comprise a pliable backing.

12. The battery pack of claim 11 wherein said pliable backing comprises polyurethane.

13. A flexible battery pack for holding and connecting a button type battery comprising:

a first fabric having a perimeter;

a first conductive trace in juxtaposition to said first fabric;

a second fabric;

a second conductive trace in juxtaposition to said second fabric; and wherein the first fabric is attached to the second fabric along said perimeter creating said battery pouch such that a battery when placed within battery pouch is electrically connected to said first and second conductive traces.

14. A flexible battery pack for holding and connecting a button type battery comprising:

a first felt fabric having a first pliable urethane backing and a perimeter;

a first conductive ink trace affixed said first pliable urethane backing;

a second felt fabric having a second pliable urethane backing and a slit;

a second conductive ink trace affixed said second pliable urethane backing; and wherein said first fabric is sonically welded along said perimeter to said second fabric creating a battery pouch such that said battery can be placed into said battery pouch through said slit.

15. The battery pack of claim 14 wherein said battery is electrically connected to said first and second conductive traces when placed within said battery pouch.

* * * * *